United States Patent [19]
Fujita

[11] Patent Number: 5,789,983
[45] Date of Patent: Aug. 4, 1998

[54] HIGH-FREQUENCY AMPLIFIER HAVING VARIABLE GAIN IN RESPONSE TO INPUT POWER LEVEL

[75] Inventor: Masanori Fujita, Tokyo, Japan

[73] Assignee: NEC Corporation, Tokyo, Japan

[21] Appl. No.: 604,238

[22] Filed: Feb. 21, 1996

[30] Foreign Application Priority Data

Feb. 28, 1995 [JP] Japan ................ 7-040170

[51] Int. Cl.[6] .................................................. H03F 3/193
[52] U.S. Cl. ........................ 330/277; 330/285; 330/296
[58] Field of Search ............................... 330/277, 285, 330/296; 455/127, 252.1

[56] References Cited

U.S. PATENT DOCUMENTS 5,371,477 12/1994 Ikeda et al. .................. 330/285 X
5,392,004 2/1995 Masliah ........................... 330/296

FOREIGN PATENT DOCUMENTS 1-160709 11/1989 Japan.

Primary Examiner—James B. Mullins
Attorney, Agent, or Firm—Young & Thompson

[57] ABSTRACT

A semiconductor amplifier such as a high-frequency amplifier has a barrier-gate transistor FETQ1 and a circuit connected to the gate of the barrier-gate transistor FETQ1 for controlling an amplification gain of the barrier-gate transistor FETQ1. In one embodiment, the circuit has a resistor RG1 being connected between a GND line and the gate of the barrier-gate transistor FETQ1 and a resistor RG2 being connected between the gate of the barrier-gate transistor FETQ1 and a VGG line for biassing the gate of barrier-gate transistor FETQ1.

9 Claims, 3 Drawing Sheets

HIGH-FREQUENCY AMPLIFIER HAVING VARIABLE GAIN IN RESPONSE TO INPUT POWER LEVEL

BACKGROUND OF THE INVENTION

1. Field of the Invention

The present invention relates to a high-frequency amplifier and, more particularly, to a high-frequency amplifier having variable gain in response to input power level.

2. Description of the Related Art

Recently, a device used for an amplifier for amplifying a high-frequency signal such as a microwave band signal mainly uses a gallium-arsenide Schottky barrier-gate field effect transistor (hereinafter referred to as GaAs FET) because it is high-speed and low-noise. FIG. 3 shows a block diagram of an example of the receiving front end portion of a portable mobile-communication system, for example a personal hand-phone system (PHS), of L to S bands using this type of GaAs FET amplifier. In FIG. 3, a received signal input from an antenna 1 passes through a band-pass filter 2 and is power-amplified by a low-noise amplifier 3. The amplifier 3 is the section relating to the present invention. The output of the amplifier 3 further passes through a band-pass filter 4 and thereafter, it is mixed with a local oscillator signal LO output from a local oscillator (not shown) by a mixer 5, converted to an intermediate-frequency signal IF, and set to the next circuit (not shown).

In this case, a direct current (DC) gate bias voltage of the GaAs FET constituting the amplifier 3 has generally been fixed to a certain value. Therefore, a noise figure (NF) or gain characteristic of the amplifier 3 is kept at a certain value. In the case of mobile communication, however, levels of a received signal input from the antenna 1 of the portable system greatly change depending on the distance between a base station and the portable system or the surrounding environment. Therefore, it may be impossible to fetch information by demodulating received signals because the received signals are excessively input and mixer 5 is saturated. To prevent the above problem, the amplifier 3 is generally designed so that the mixer 5 is not saturated even when the received-signal level is over-input by keeping the gain of the amplifier 3 at a certain level or lower. However, when the amplifier 3 is designed as described above, a problem occurs that a receiving sensitivity is lowered when the received-signal level is low.

Therefore, an amplifier provided with an automatic gain control (AGC) function is proposed in which the gate bias voltage supplied to the GaAs FET of the amplifier 3 is controlled by an external circuit to automatically change the gain. FIG. 4 shows a block diagram of the amplifier disclosed in the Japanese Utility Model Application Laid-Open Hei 1-160709 as an example of the above type of amplifier. The amplifier detects an output level of a GaAs FET amplifier 14 by a detection circuit 16. The amplifier controls an output electric power $P_{out}$ of the amplifier 14 by comparing the detected level with a reference voltage by a comparison circuit (comprising an operational amplifier 18 and a voltage generation circuit 19) and changing the gate bias voltages of the GaAs FET by a D/D converter 17 in accordance with the comparison result. That is, in the case of the amplifier provided with AGC function disclosed in the above conventional art, the out electric power $P_{out}$ is controlled not directly by an input electric power $P_{in}$ of a high-frequency input signal but indirectly through a process of detecting an output level of the amplifier.

To apply the GaAs FET amplifier provided with AGC function disclosed in the above conventional art to, for example, the receiving front end of the portable mobile-communication system of L to S bands shown in FIG. 3, a plurality of peripheral units and circuits such as the detection circuit 16, offset voltage generation circuit 19, and operational amplifier 18 are necessary in order to detect an output level of the amplifier 14. Moreover, because the gate bias voltages of the GaAs FET are changed in accordance with the detected level, extra software and circuits such as a program for determining a level of the gate bias voltage and the D/D converter 17 for actually supplying the gate bias voltage in accordance with the program are necessary on the signal line. Furthermore, a coupler (directional coupler) for detecting an output level of the amplifier (not shown) and a diode for wave detection (not shown) are necessary on the signal line. That is, problems occur in that costs are increased due to increase of the steps for managing parts and assembling, mounting area increases, and thereby, loss is produced.

In the case of a portable telephone set or a digital cordless telephone set, there are various severe restrictions such as decrease in size, decrease in power consumption, and decrease in cost. Therefore, the following are not accepted: increase of the numbers of parts used and circuits due to practical use of the amplifier disclosed in the above prior art, increase of power consumption and mounting area due to the increase of the numbers of parts and circuits, and increase of costs.

SUMMARY OF THE INVENTION

Accordingly, an object of the preset invention is to decrease power consumption, occupying area and costs.

To achieve the above objects, the semiconductor circuit of the present invention comprises a barrier-gate transistor connected between a first voltage line and a second voltage line, and a gate of the barrier-gate transistor being connected to a first node, and a circuit connected to the first node for controlling an amplification gain of the barrier-gate transistor in accordance with a signal power applying to the first node.

Thus, the high-frequency amplifier of the present invention uses the fact that the gradient of a gate current-voltage characteristic curve of a barrier-gate FET serving as an amplification device is asymmetric to a certain value of the gate-source voltage (equivalent to the anode-cathode voltage of a diode) in a reverse-direction region. That is, when swinging the gate-source voltage of an FET in the positive direction and the negative direction equally about the change point of the gate current-voltage characteristic in accordance with a high-frequency input signal, reverse gate current changes because current with the largest current change rate is added to the original current as a difference. The direction of the change is the same as a direction for decreasing a reverse gate current (bound for a gate electrode from a channel by exceeding a gate barrier). In the case of the present invention, the current flowing through a resistance for determining the gate voltage of an FET is decreased due to decrease of the reverse gate current.

As a result, the effective gate bias voltage of the FET deepens in the negative direction, the drain-source current decreases, and the gain of an amplifier decreases.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
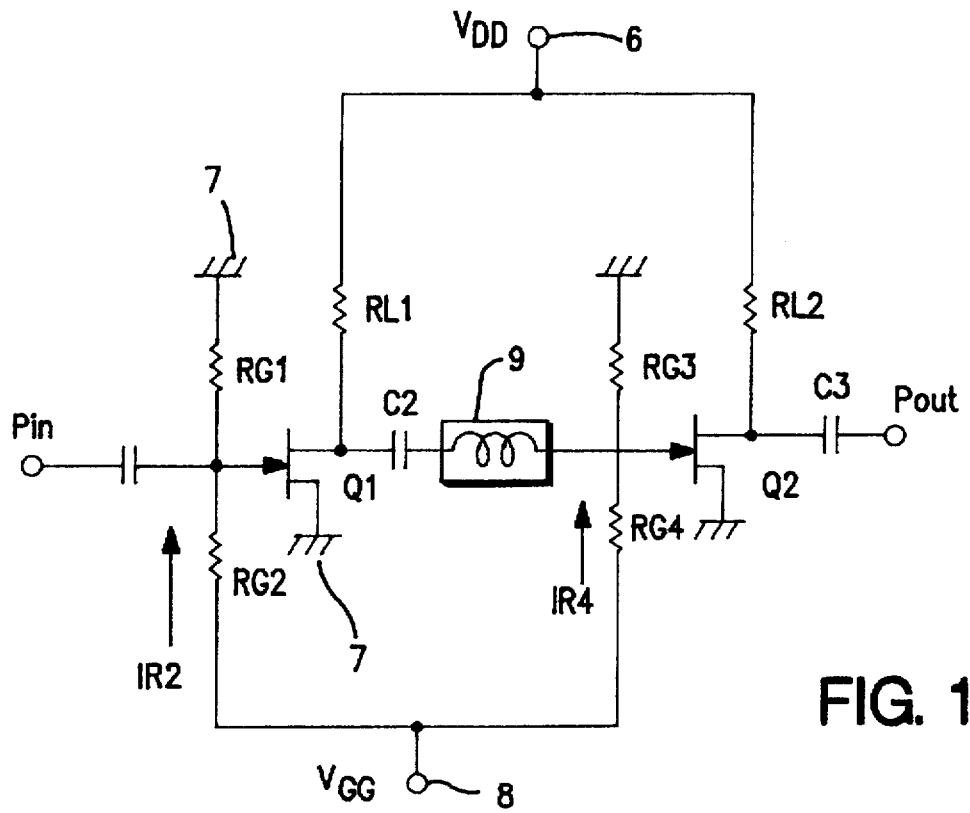
FIGS. 1(a), 1(b) are a circuit diagram of an embodiment of the present invention and an illustration showing the current-voltage characteristic of the Schottky barrier gate of a GaAs FET using the embodiment.

An embodiment of the high-frequency amplifier shown in FIG. 1(a) comprises a two vertical GaAs FET amplification parts. The first amplification part comprises an n-channel depletion-type GaAs FET Q1, a capacitor C1, a pair of resistors RG1 and RG2. The drain electrode of the GaAs FET Q1 is connected to a power-supply-voltage feed line (voltage $V_{DD}$=5.8 [V]) 6 through the load resistor $R_{L1}$, the source electrode is connected to a ground line (reference voltage) 7 and the gate electrode is connected to an input terminal Pin through the capacitor C1. A DC bias voltage obtained by resistance-dividing the portion between the ground line 7 and a gate-voltage feed line (voltage $V_{GG}$=−3.0 [V]) 8 by two serially-connected resistors $R_{G1}$, and $RG_2$ is applied to the gate electrode. Moreover, the final amplification part comprises a GaAs FETQ2 serving as an amplification device, a load resistance $R_{L2}$, and two serially-connected resistances $R_{G3}$ and $R_{G4}$ constituting a gate bias circuit. The FETQ2 is also the n-channel depletion type. Each elements of the final amplification part is connected similarly to the initial amplification part. The gate of the GaAs FETQ2 is connected to the drain of the GaAs FETQ1 through a capacitor C2 and a micro-strip line having L component. The drain of the GaAs FETQ2 is connected to an output terminal Pout through a capacitor C3. Though this embodiment comprises two vertical amplification parts, the final amplification part has the same structure as the initial amplification part as shown by the circuit diagram in FIG. 1(a). The final amplification part is used as an output stage for adjustment of the whole amplification rate or adjustment of output impedance. Therefore, it is unnecessary that the present invention has a double-stage structure, and the functions and advantages of the present invention can be obtained even if the present invention is an amplifier having a single-stage structure of only the initial or final amplification part. Therefore, the subsequent description is made mainly for the initial amplification part.

Operations of this embodiment are described below. In FIG. 1(a), it is assumed that $R_{G1}$ is equal to 2 kΩ, $R_{G2}$ is equal to 1 kΩ, $R_{G3}$ and $R_{G4}$ are equal to 3 kΩ, and $V_{GG}$ is equal to −3.0 [V]. In this case, at the initial amplification part, a current $I_{R2}$ flowing through the resistance $R_{G2}$ in the direction of the ground line 7 from the gate voltage feed line 8 equals to −1.0 [mA] and a gate bias voltage $V_{G1}$=−2.0 [V] is applied to the gate electrode of the GaAs FETQ1. However, a reverse gate current, that is, a current from the gate electrode side toward the series-connection point between the resistances $R_{G1}$ and $R_{G2}$ flows through the Schottky barrier diode at the gate section of the FETQ1 but the reverse gate current is ignored as described later. Similarly, a current $I_{R4}$=−0.5 [mA] flows from the gate voltage feed line 8 toward the ground line 7 at the final amplification part and a DC gate bias voltage $V_{G2}$=−1.5 [V] is applied to the gate electrode of the GaAs FETQ2 by the current $I_{R4}$.

Figure 1B:
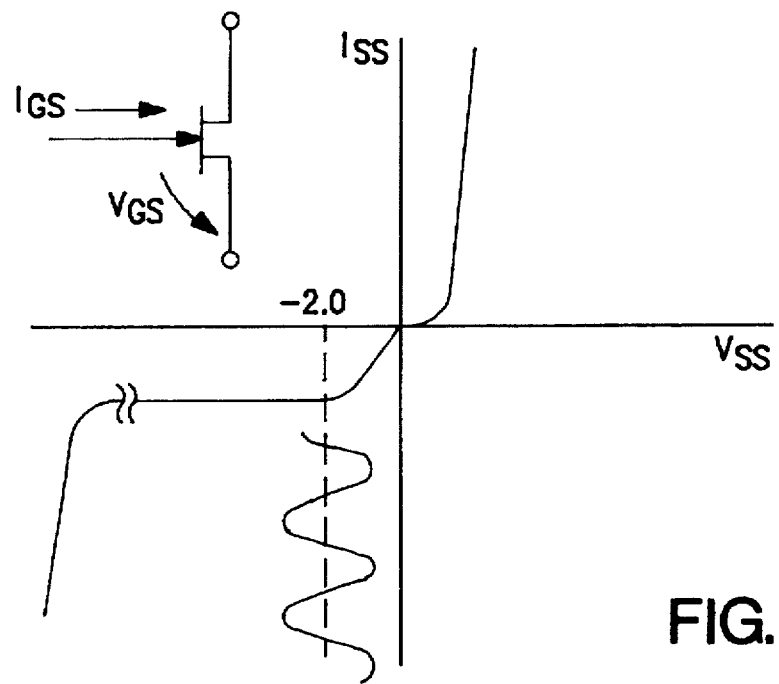

Under the above state, a case is considered in which an input signal is input to the gate electrode. First, the dependency of a gate current $I_{GS}$ (the direction in which the current flows from the gate electrode side into the channel through the Schottky barrier is assumed to be positive) of the GaAs FETQ1 on a gate-source voltage $V_{GS}$ (the direction from the gate electrode side toward the source electrode is assumed to be positive) is shown in Fig. 1(b). In FIG. 1(b) shows the vertical axis at the reverse current side by enlarging it to the vertical axis at the forward current side. In this case, gradients of the current curve greatly change at a voltage $V_{GS}$=−2.0 [V] in the case of the reverse current. That is, the gradient in a region where a reverse gate voltage $V_{GS}$ has a large absolute value is gradual, but it is steep in a region where the voltage $V_{GS}$ has a small absolute value.

Under the above state, a case is considered in which a high-frequency input signal is input to the input terminal Pin. That is, as shown in FIG. 1(b), by changing the gate-source voltage of the FETQ1 about $V_{GS}$=−2.0 [V], the current $I_{R2}$ flowing through the resistance $R_{G2}$ is changed due to change of the voltage $V_{GS}$. The gate-source voltage $V_{GS}$ swings in the positive direction and negative direction equally about the voltage of −2.0 [V]. However, because the gate current $I_{GS}$ changes asymmetrically to the gate-source voltage $V_{GS}$, the current with the largest current change appears as a difference and the gate current $I_{GS}$ is biased to the current with the largest current change rate on the average. The gate current in the negative direction decreases.

That is, by inputting a high-frequency signal, the current flowing into the series-connection point between the resistances $R_{G1}$, and $R_{G2}$ from the gate electrode decreases. As a result, the current flowing through the resistance $R_{G2}$ decreases and the voltage of the connection point between the two resistances $R_{G1}$ and $R_{G2}$, that is, the gate voltage of the FETQ1 approaches the voltage (=−3.0 [V]) of the gate voltage feed line 8.

Thus, because the gate voltage fluctuates in the deeper direction, a depletion layer under the gate electrode further expands in the channel, the drain-source current decreases, and the amplification factor reduces. As shown by the gate current-voltage characteristic in FIG. 1(b), movement of the gate voltage in the negative direction due to the above input high-frequency signal and reduction of the amplification factor increase as the amplitude of the high-frequency input signal, in other words, the power of the input signal increases.

Figure 2:
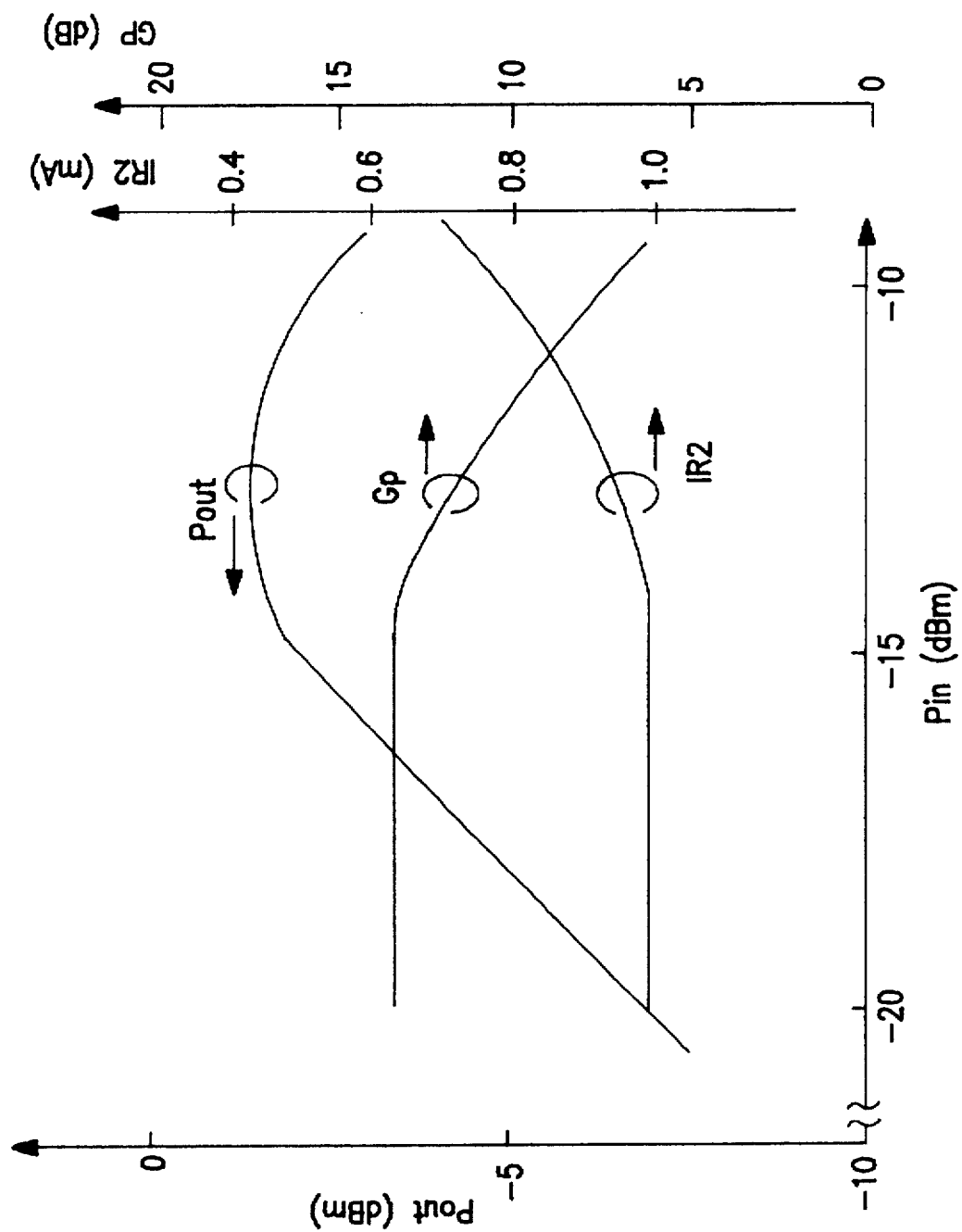
FIG. 2 is an illustration showing the characteristic of the initial amplification stage of the circuit shown in Fig. 1(a)

The relation between the input power supplied to the input terminal $P_{in}$ of a high-frequency signal(frequency f=1.9 [GHz]) is shown in FIG. 2, the output power output to the output terminal $P_{out}$ of an amplification signal, the gain $G_P$, and the current $I_{R2}$ flowing through the resistance $R_{G2}$ when the power-supply voltage $V_{DD}$ to the drain electrode is set to 5.8 [V] and the voltage $V_{GG}$ of the gate voltage feed line 8 is set to −3.0 [V] about the front-stage amplifier (using the FETQ1 as an amplification device) of this embodiment in Fig. 1(a). When the input power supplied to the input terminal $P_{in}$ is small and kept in a range between −20 and −15 [dBm], the current $I_{R2}$ is almost constantly kept at −1.0 [mA]. The output power output to the output terminal $P_{out}$ increases proportionally to the input power supplied to the input terminal $P_{in}$ and therefore, the gain $G_P$ is constantly kept at 13 [dB]. When the input power supplied to the input terminal $P_{in}$ increases, the absolute value of the current $I_{R2}$ starts decreasing from the point of $P_{in}$=−14 [dBm] and $I_{R2}$ comes to −0.7 [mA] when the input power supplied to the input terminal $P_{in}$ becomes equal to −9 [dBm]. In this case, the gate voltage $V_{GS}$ of the FETQ$_1$ shows −2.3 [V]. It is confirmed that the output power output to the output terminal $P_{out}$ and the gain $G_P$ decrease as the current $I_{R2}$ decreases and the gain $G_P$ decreases by 6 to 7 [dB] at a near saturation point, that is, at the current $I_{R2}$ of −0.7 [mA] and the gate voltage $V_{GS}$ of −2.3 [V].

From the above operational description, it is understood that the gain $G_P$ of the amplifier of the present invention is not indirectly controlled by the output power output to the output terminal $P_{out}$, but it is directly controlled by the input power supplied to the input terminal $P_{in}$. This is because the amplification device of the present invention uses a Schottky barrier-gate (SBG) FET such as a GaAs FET. In the SBG FET, a gate current flows through a barrier correspondingly to a gate voltage differently from charge or discharge current of the gate capacitance of a metal oxide semiconductor (MOS) FET. Even a conventional amplifier using a GaAs FET almost prevents the above gate current from flowing through a gate bias circuit by using a large resistance of, for example, tens of kΩ. In the case of the above structure, decrease of gain at the near saturation point is approx. 1 [dB] at most because the gate voltage hardly changes even if input electric power increases. However, to change bias points for gain adjustment, it cannot be avoided to change output voltages of a gate-biasing power supply circuit (equivalent to the gate voltage feed line 8 of this embodiment) similarly to the case of the amplifier disclosed above. However, the present invention positively uses the fact that a reverse gate current flows. That is, by noting that the current-voltage characteristic of the reverse gate current is asymmetric to a DC bias point, a DC bias point is set to a position nearby the change point of the characteristic. To set the DC bias point, a resistance division circuit of two resistances $R_{G1}$ and $R_{G2}$ is used. According to this structure, the DC bias point can be determined only by the ratio between two resistance values. Moreover, a gain decrease value due to a high-frequency signal input is determined by the absolute value of a resistance. In the present invention, though it is necessary that the DC bias voltage and the absolute value of the resistance $R_{G2}$ of the gate bias circuit can independently be selected in order to directly control the gain $G_P$ by the input power supplied to the input terminal $P_{in}$, the bias circuit according to resistance division realizes the above mentioned.

Figure 3:
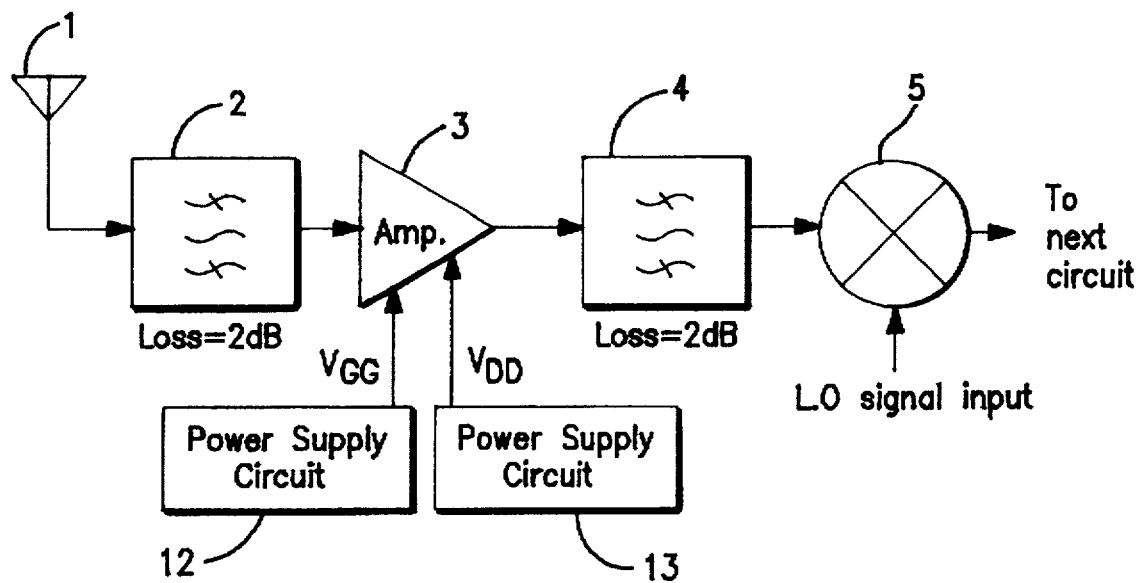
FIG. 3 is a block diagram of the receiving front-end section of PHS.
Figure 4:
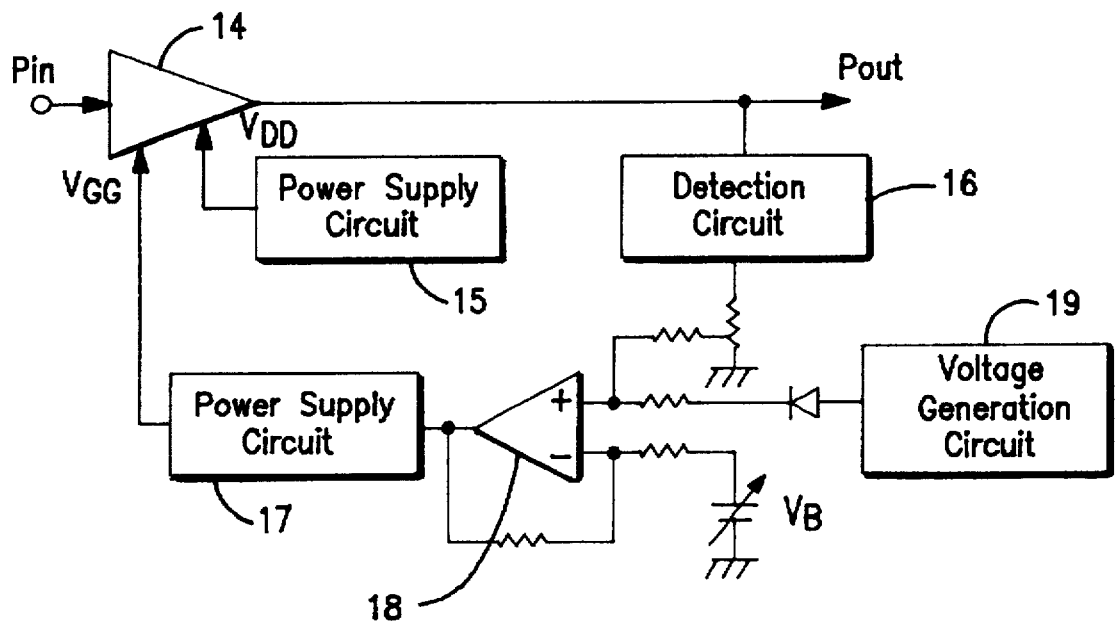
FIG. 4 is a block diagram of a conventional amplifier.

As the result of calculating the characteristic of the front end section of the amplifier of the present invention, the total NF is obtained as 6 [dB] and the gain up to the front of the mixer is obtained as 11 [dB] by assuming that the amplifier of the present invention is applied to PHS (f=1.9 [GHz]) serving as a domestic digital cordless system, and in the block diagram shown in FIG. 3, the loss of the band-pass filters 2 and 4 is 2 [dB], the intercept point (point where the level of a tertiary high-frequency distortion is equal to that of the output $P_{out}$) IP$_3$ of the mixer 5 is 0 [dBm], NF of it is 12 [dB], the amplifier 3 uses this embodiment, and the gain of the mixer 5 is 15 [dB] and NF of it is 2 [dB] in order to prevent overload of the mixer 5. According to the amplifier of the present invention, it can be expected from FIG. 2 that the gain decreases by approx. 10 [dB] for an over-input in which a change of the gate voltage in one direction exceeds 0.3 [V]. Therefore, it is possible to raise the normal gain up to approx. 25 [dB]. Therefore, the front end characteristic is improved because the total NF comes to 5 [dB] and the gain up to the front of the mixer comes to 21 [dB]. Thereby, it is possible to improve the receiving sensitivity when the level of a received signal is low. Therefore, the dynamic range of reception widens by approx. 10 to 15 [dB] compared to a conventional set. Moreover, in this case, because a special control system or circuit is not necessary, it is possible to improve the characteristic of the set without increasing the number of parts or the mounting area of the set.

Resistance values of the resistances $R_{G1}$ and $R_{G2}$ are respectively set to the optimum value by considering the DC characteristic such as pinch-off voltage of the GaAs FETQ$_1$, gate current-voltage characteristic, or withstand voltage and the AC characteristic such as frequency used, necessary output electric power output to output terminal $P_{out}$, gain $G_P$, or structure of an externally-installed circuit. When resistance values of the gate resistances $R_{G3}$ and $R_{G4}$ of the rear-stage GaAs FETQ$_2$ are set so that they are two times or more larger than the resistance values of the resistances $R_{G1}$ and $R_{G2}$ respectively and the current $I_{R4}$ flowing through the resistance $R_{G4}$ at the final amplification stage is smaller than the current $I_{R2}$ flowing through the resistance $R_{G2}$ at the front amplification stage, the impedance at the output side does not fluctuate and influence on the mixer at the next stage can almost be ignored because the idle current of the final-stage FETQ$_2$ hardly fluctuates. However, it is also possible to set the resistance values to other values according to necessity.

In this embodiment, a case is described in which the amplification device uses a GaAs SBG FET. However, the amplification device is not restricted to the GaAs SBG FET. It is also possible to use an FET having other structure as long as the FET is of the barrier gate type. As the above amplification device, an FET having a heterojunction structure obtained by joining semiconductors each other and an SBG FET made of silicon are listed. Moreover, it is possible to use an FET having a pn-junction gate structure.

As described above, the amplifier of the present invention uses an FET having a Schottky barrier or a barrier of heterojunction or pn-junction at a gate section like a GaAs FET as the amplification device and it is constituted so as to directly control gain by input power and automatically decrease the gain for an over-input by using the fact that reverse current flowing through a gate barrier shows a behavior asymmetric to the DC bias point of a gate and thereby flowing the current through the barrier gate.

Therefore, the present invention makes it possible to decrease the gain for an over-input by a simple circuit structure, compared to a conventional amplifier which monitors output power and changes a gate voltage in accordance with the monitored result.

Moreover, the amplifier of the present invention does not require any peripheral part or program for gain control differently from a conventional amplifier. Therefore, the amplifier of the present invention is superior to the conventional amplifier in the mounting area and makes it possible to decrease the manufacturing cost including part management man-hours and assembling man-hours.

Furthermore, the amplifier of the present invention using a microwave band transistor such as a GaAs FET for the amplification device is very effective when using the amplifier for the receiving front-end section of a portable mobile-communication system of L to S bands whose small size and low cost are stressed such as PHS.

What is claimed is:

1. A semiconductor circuit comprising:
   a barrier-gate transistor connected between a first voltage line and a second voltage line, a gate, of said barrier-gate transistor being connected to a first node;
   a circuit connected to said first node for controlling an amplification gain of said barrier-gate transistor in accordance with a signal power applied to said first node;

said circuit comprising a biasing circuit for biasing said first node to a predetermined voltage which comprises a first resistance element connected between said first voltage line and said first node, and a second resistance element connected between said first node and a third voltage line.

2. A semiconductor circuit comprising:

a first barrier-gate transistor connected between a first voltage line and a second voltage line and a gate of said first barrier-gate transistor being connected to a first node;

a first circuit connected to said first node for controlling an amplification gain of said first barrier-gate transistor based on a signal power applying to said first node;

a first capacitor connected between said first voltage line and a second node;

a strip line connected between said second node and a third node;

a second barrier-gate transistor connected between said first voltage line and said second voltage line, a gate of said second barrier-gate transistor being connected to said third node;

a second circuit connected to said third node for controlling an amplification gain of said second barrier-gate transistor based on a signal power applied to said third node;

wherein said first circuit comprises a first resistance element connected between said first node and a third voltage line a second resistance element connected between said first node and said second voltage line; and wherein said second circuit comprises a third resistance element connected between said third node and said third voltage line and a fourth resistance element connected between said third node and said second voltage line.

3. The semiconductor circuit as claimed in claim 2 further comprising a second capacitor connected between said first node and an input terminal for supplying a high-frequency input signal.

4. The semiconductor circuit as claimed in claim 3 further comprising a third capacitor connected between said first voltage line and an-output terminal.

5. The semiconductor circuit claimed in claim 2, wherein said barrier gate transistor comprises a Schottky barrier-gate transistor.

6. The semiconductor circuit as claimed in claim 5 wherein said Schottky barrier-gate transistor comprises a GaAs Schottky barrier-gate transistor.

7. A mobile communication system having a high frequency amplifier which comprises:

a barrier-gate transistor connected between a first voltage line and a second voltage line, a gate of said barrier-gate transistor being connected to a first node;

a circuit connected to said first node for controlling an amplification gain of said barrier-gate transistor based on a signal power of said first node;

said circuit comprising a first resistance element connected between said first voltage line and said first node and a second resistance element connected between said first node and a third voltage line.

8. The system as claimed in claim 7 wherein said barrier gate transistor comprises a Schottky barrier-gate transistor.

9. The semiconductor circuit as claimed in claim 8 wherein said Schottky barrier-gate transistor comprises a GaAs Schottky barrier-gate transistor.

\* \* \* \* \*